United States Patent
Chen et al.

(10) Patent No.: US 12,171,136 B2
(45) Date of Patent: Dec. 17, 2024

(54) SOLAR CELL CUTTING AND PASSIVATION INTEGRATED PROCESSING METHOD AND SOLAR CELL THEREOF

(71) Applicant: Hangzhou Microquanta Semiconductor Co., Ltd., Zheijiang (CN)

(72) Inventors: Feng Chen, Zhejiang (CN); Buyi Yan, Zhejiang (CN); Jizhong Yao, Zhejiang (CN)

(73) Assignee: Hangzhou Microquanta Semiconductor Co., Ltd., Zhejiang (CN)

( * ) Notice: Subject to any disclaimer, the term of this patent is extended or adjusted under 35 U.S.C. 154(b) by 191 days.

(21) Appl. No.: 17/638,409

(22) PCT Filed: Jun. 1, 2020

(86) PCT No.: PCT/CN2020/093813
§ 371 (c)(1),
(2) Date: Feb. 25, 2022

(87) PCT Pub. No.: WO2021/036383
PCT Pub. Date: Mar. 4, 2021

(65) Prior Publication Data
US 2022/0320439 A1    Oct. 6, 2022

(30) Foreign Application Priority Data

Aug. 26, 2019   (CN) .......................... 201910792106.2

(51) Int. Cl.
*H10K 71/00*     (2023.01)
*H01G 9/20*      (2006.01)
(Continued)

(52) U.S. Cl.
CPC ......... *H10K 71/621* (2023.02); *H01G 9/2009* (2013.01); *H10K 30/451* (2023.02); *H10K 30/88* (2023.02)

(58) Field of Classification Search
CPC .... H10K 71/621; H10K 30/451; H10K 30/88; H10K 30/57; H01G 9/2009; Y02P 70/50;
(Continued)

(56) References Cited

U.S. PATENT DOCUMENTS 8,048,778 B1 *  11/2011  Ku .......................... H01L 21/78
                                                    257/E21.599
9,166,094 B2   10/2015  Lee et al.
(Continued)

FOREIGN PATENT DOCUMENTS

CN    101179087    5/2008
CN    101399295    4/2009
(Continued)

OTHER PUBLICATIONS

International Search Report and Written Opinion in International Appln. No. PCT/CN2020/093813, dated Sep. 2, 2020, 5 pages [English Translation of Search Report].
(Continued)

*Primary Examiner* — Angelo Trivisonno
(74) *Attorney, Agent, or Firm* — Fish & Richardson P.C.

(57) ABSTRACT

Disclosed are a solar cell cutting and passivation integrated processing method and a solar cell prepared using the method. The solar cell includes a substrate (1), a front electrode layer (2), a light absorption layer (3) and a back electrode layer (4) from bottom to top. Before laser structured cutting is performed for the back electrode layer (4), a protective layer (5) is disposed on a surface of the back electrode layer (4), and then laser structured cutting is performed for the back electrode layer (4), or the back (Continued)

electrode layer (4) and the light absorption layer (3) simultaneously through the protective layer (5) to obtain a corresponding structured trench (P3) while the protective layer (5) is kept from being cut by laser, and a material of the protective layer (5) is partially molten due to a localized high temperature generated by the laser processing in a laser structured cutting process and infiltrates into an underlying corresponding structured trench (P3). In this method, at the time of performing laser cutting processing, passivation is performed for newly-processed trench at the same time, reducing production costs, saving processing time. Further, the trench edges after cutting are repaired to improve the morphology of the processed trench, improving the stability of the cell and extending the service life of the cell.

14 Claims, 2 Drawing Sheets

(51) Int. Cl.
*H10K 30/00* (2023.01)
*H10K 30/88* (2023.01)

(58) Field of Classification Search
CPC ............. H01L 31/1868; H01L 31/0463; H01L 21/3043; H01L 31/04; H01L 31/1876
See application file for complete search history.

(56) References Cited

U.S. PATENT DOCUMENTS

| | | |
|---|---|---|
| 2015/0020864 A1 | 1/2015 | Dufourcq et al. |
| 2015/0068578 A1 | 3/2015 | Probst et al. |
| 2016/0211395 A1 | 7/2016 | Herrmann et al. |
| 2019/0198259 A1* | 6/2019 | Aranami ............... H01L 31/046 |

FOREIGN PATENT DOCUMENTS

| | | |
|---|---|---|
| CN | 102543868 | 7/2012 |
| CN | 103165712 | 6/2013 |
| CN | 106030827 | 10/2016 |
| CN | 109994563 | 7/2019 |
| CN | 111463315 | 7/2020 |
| JP | H 02-100375 | 4/1990 |
| JP | H04234178 | 8/1992 |
| JP | 2010-087041 | 4/2010 |
| JP | 2013-149698 | 8/2013 |
| JP | 2013-152980 | 8/2013 |
| JP | 2013-206889 | 10/2013 |
| JP | 2014-063848 | 4/2014 |
| JP | 2015-050349 | 3/2015 |
| WO | WO 2010106638 | 9/2010 |
| WO | WO 2021036383 | 3/2021 |

OTHER PUBLICATIONS

Office Action in Chinese Appln. No. 201910792106.2 dated Apr. 26, 2021, 15 pages (English Translation).
Search Report in Chinese Appln. No. 201910792106, dated Apr. 17, 2021, 2 pages.
Supplemental Search Report in Chinese Appln. No. 201910792106.2, dated Jul. 19, 2021, 1 page.

* cited by examiner ively exposed. The exposed light absorption layer B is directly exposed to air and may easily react with various ingredients of the air to cause effective ingredients to be decomposed, thus further weakening stability of the solar cell and reducing the service life of the solar cell.

SOLAR CELL CUTTING AND PASSIVATION INTEGRATED PROCESSING METHOD AND SOLAR CELL THEREOF

CROSS REFERENCE TO RELATED APPLICATIONS

This application is a U.S. national phase filing under 35 U.S.C. § 371 of International application number PCT/CN2020/093813, filed Jun. 1, 2020, which claims priority from Chinese application number 201910792106.2, filed Aug. 26, 2019. The entire contents of the prior applications are incorporated herein by reference in their entirety.

TECHNICAL FIELD

The present invention relates to the field of solar cell processing and preparation technologies, and in particular to a solar cell cutting and passivation integrated processing method and a solar cell thereof.

BACKGROUND

In an existing manufacturing process of a solar cell, a laser scribing process is usually employed to perform laser cutting processing for a solar cell assembly. The common laser scribing process is mainly divided into three steps, and each step includes one process of structured trenches, which is also referred to as processing line, abbreviated as P1, P2 and P3 processing lines, as shown in FIGS. 1 and 2. The three processing lines are arranged in sequence, and the section from P1 to P3 is a dead zone part of the solar cell, where the P1 processing line is mainly to cut off a front electrode layer A, and process a structured trench by laser beam on the front electrode layer A; the P2 processing line is mainly to cut off a light absorption layer B and process another structured trench by laser beam on the light absorption layer B; the P3 processing line is mainly to cut off a back electrode layer C or the back electrode layer C and the light absorption layer B, and process a third structured trench by laser beam on the back electrode layer C. After P1 cutting processing, the light absorption layer B is prepared and the material of the light absorption layer fills up and covers the P1 processing line. After P2 cutting processing, the back electrode layer C is prepared, and the material of the back electrode layer fills up and covers the P2 processing line. After P3 cutting processing, the surface of the back electrode layer C is not covered with any other covering material, such that the light absorption layer B and the front electrode layer A are directly exposed. The exposed light absorption layer B is directly exposed to air and may easily react with various ingredients of the air to cause effective ingredients to be decomposed, thus further weakening stability of the solar cell and reducing the service life of the solar cell.

In another aspect, an existing cutting process cannot obtain a smooth and flat P3 structured trench. When the existing P3 cutting is performed, it is easy to produce edge collapse and the like at both side edges of the trench, such that the edges of the P3 structured trench is roughened. Further, it is possible that conducive ingredients, such as material scraps and the like, of the back electrode layer fall into the trench after being processed, and thus, the back electrode layer C and the front electrode layer A may be short-circuited due to direct contact, or other substances fall into the trench and react with the material of the light absorption layer, causing the material to be decomposed and so on.

In an existing solution, after P3 laser processing, a protective layer is added to cover the P3 structured trench. This manner requires addition of one procedure, leading to increased costs. Before the protective layer is added, P3 trench is still in an exposed state. Furthermore, the material of the protective layer has difficulty in entering the P3 trench and cannot completely and well cover the P3 trench, producing unstable effect. It is very difficult to achieve the addition of the protective layer.

SUMMARY

In order to solve the above technical problems, the present invention provides a solar cell cutting and passivation integrated processing method and a solar cell thereof. At the time of performing laser cutting processing, passivation is performed for a newly-processed trench at the same time, without needing the procedure of covering a protective layer after laser processing, greatly reducing production costs, saving processing time and significantly reducing an exposure time of the back electrode layer after P3 cutting processing. Further, the trench edges after P3 cutting are repaired to improve the morphology of the P3 trench, improve the stability of cell and extending the service life of the cell.

The present invention is implemented by providing a solar cell cutting and passivation integrated processing method, where a solar cell sequentially comprises a substrate, a front electrode layer, a light absorption layer and a back electrode layer from bottom to top. Before laser structured cutting is performed for the back electrode layer, a protective layer is disposed on a surface of the back electrode layer, and then laser structured cutting is performed for the back electrode layer, or the back electrode layer and the light absorption layer simultaneously through the protective layer to obtain a corresponding structured trench while the protective layer is kept from being cut by laser. A material of the protective layer is partially molten due to a localized high temperature generated by the laser processing in a laser structured cutting process and infiltrates into an underlying corresponding structured trench.

Furthermore, the solar cell cutting and passivation integrated processing method further includes: after the laser structured cutting process is completed for the back electrode layer or the back electrode layer and the light absorption layer simultaneously, removing the protective layer on the surface of the back electrode layer, and retaining the material of the protective layer infiltrating into the structured trench.

Furthermore, during laser structured cutting, laser ray performs processing for the back electrode layer at a side surface where the protective layer is located.

Furthermore, during laser structured cutting, laser ray performs processing for the back electrode layer at a side surface where the substrate is located.

Furthermore, the material of the protective layer is an inert material with a melting point below 600° C. and a conductivity below $10^{-7}$ S/M.

Furthermore, the protective layer is made of a polymer plastic material.

Furthermore, the polymer plastic includes polydimethylsiloxane, polyphosphazene, polyethylene, polypropylene, and polystyrene.

Furthermore, the polymer plastic is coated onto the surface of the back electrode layer by coating to prepare a glue film.

The present invention is further implemented by providing a solar cell, where a structured trench on a back electrode layer of the solar cell is processed using the solar cell cutting and passivation integrated processing method as described above.

The present invention is further implemented by providing a solar cell, where a structured trench on a back electrode layer and a light absorption layer of the solar cell is processed using the solar cell cutting and passivation integrated processing method as described above.

Compared with the prior arts, in the solar cell cutting and passivation integrated processing method and the solar cell thereof in the present invention, when structured cutting is performed for the back electrode layer or the back electrode layer and the light absorption layer simultaneously by laser beam, a molten part of the material of the protective layer due to a localized high temperature generated by laser processing is enabled to flow into a newly-processed structured trench, which is equivalent to saving a procedure in which a protective material is deposited after one back electrode layer is cut, greatly reducing costs and saving production time. Furthermore, the deposition of the protective material at the time of cutting the back electrode layer may guarantee the accuracy of a deposition position so that the protective material can be accurately deposited in the structured trench of the back electrode layer, so as to more completely cover the narrow trench. Further, the filling process is faster, significantly reducing an exposure time of the light absorption layer after laser cutting. Due to presence of the protective material, edge collapses are difficult to occur at both side edges of the structured trench, such that the morphology of the trench can be improved, and the light absorption layer exposed by the trench can be completely wrapped and protected to avoid decomposition. Further, other impurities may be prevented from falling into the trench, avoiding other adverse influence, improving the stability of the cell and extending the service life of the cell.

DETAILED DESCRIPTION OF THE EMBODIMENTS

In order to make the technical problems to be solved, the technical solutions and beneficial effects of the present disclosure clearer and more understandable, the present invention will be further described in combination with the accompanying drawings and specific embodiments. It should be understood that the specific embodiments described herein are used only to explain the present invention rather than limit the present invention.

Figure 1:
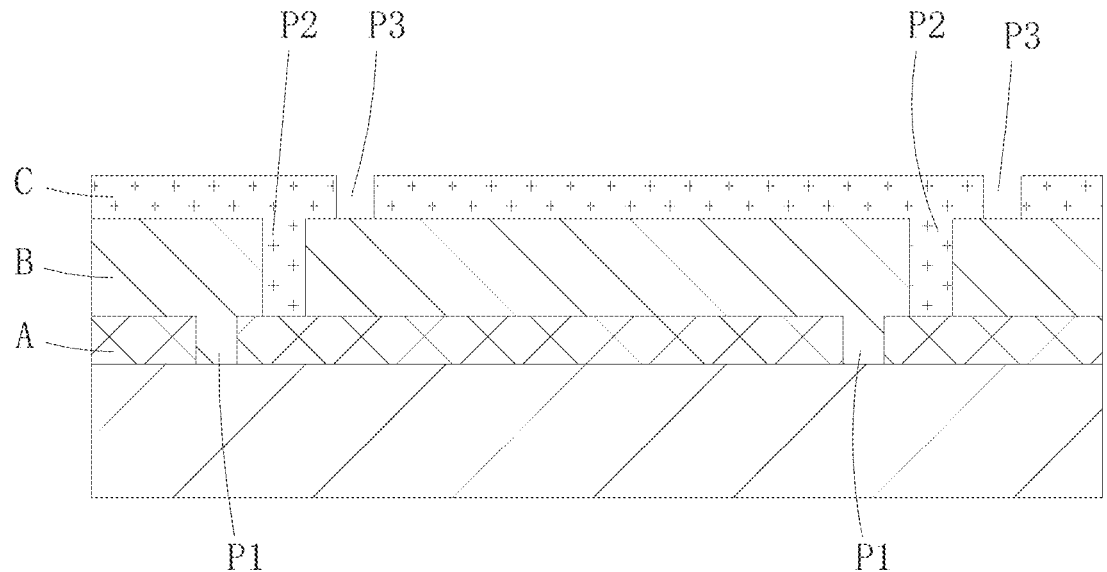
FIG. 1 is a schematic diagram illustrating laser cutting processing of an internal structure of an existing solar cell.
Figure 2:
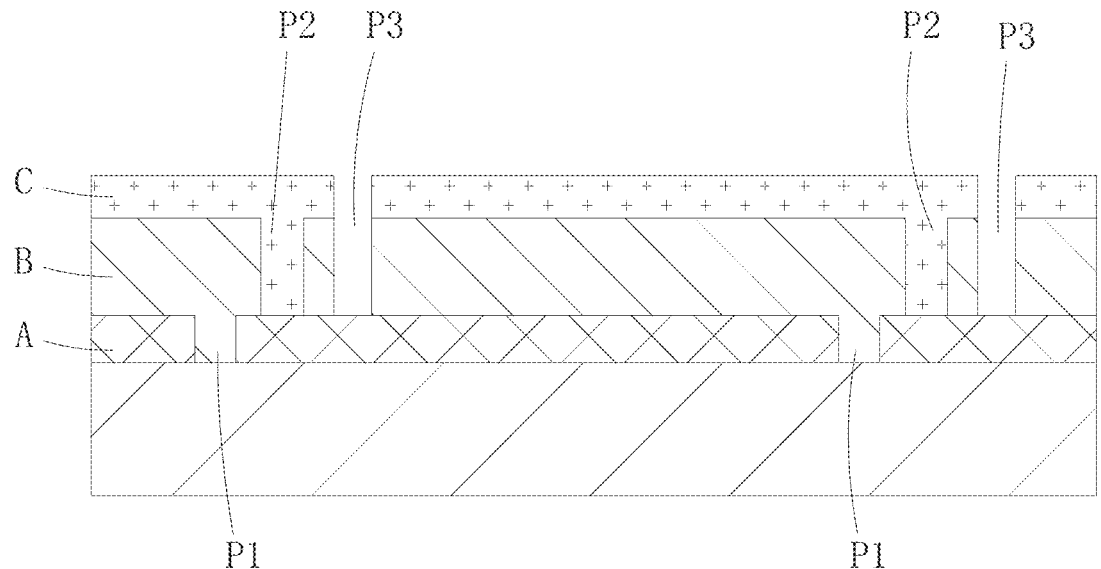
FIG. 2 is a schematic diagram illustrating laser cutting processing of an internal structure of another existing solar cell.
Figure 3:
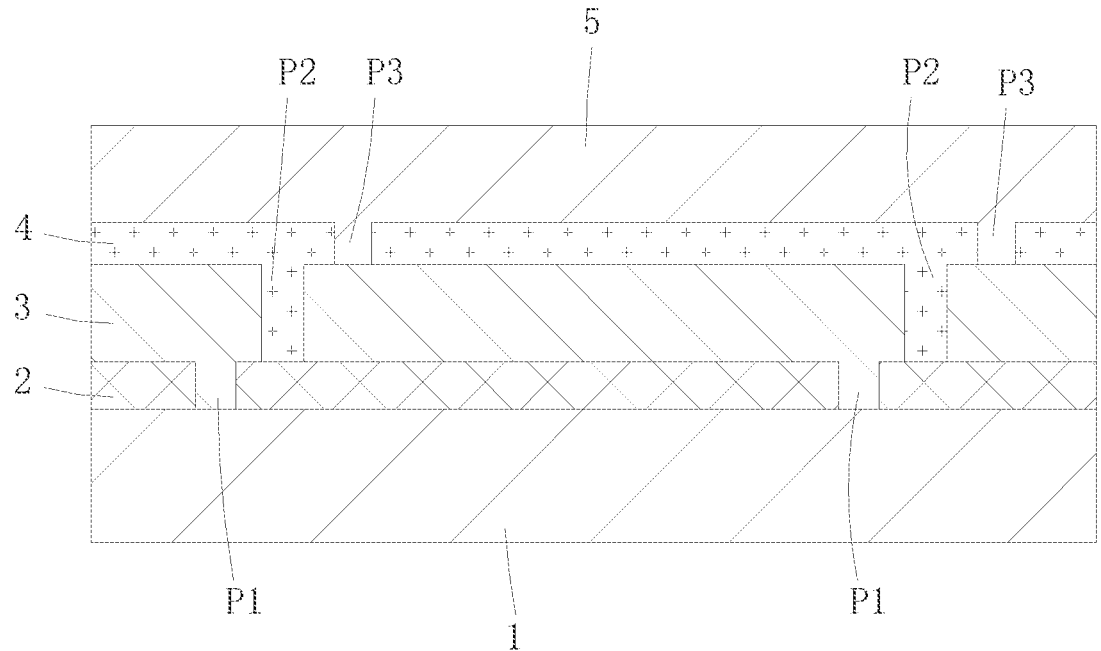
FIG. 3 is a schematic diagram illustrating laser cutting processing of an internal structure of a solar cell according to the present invention.
Figure 4:
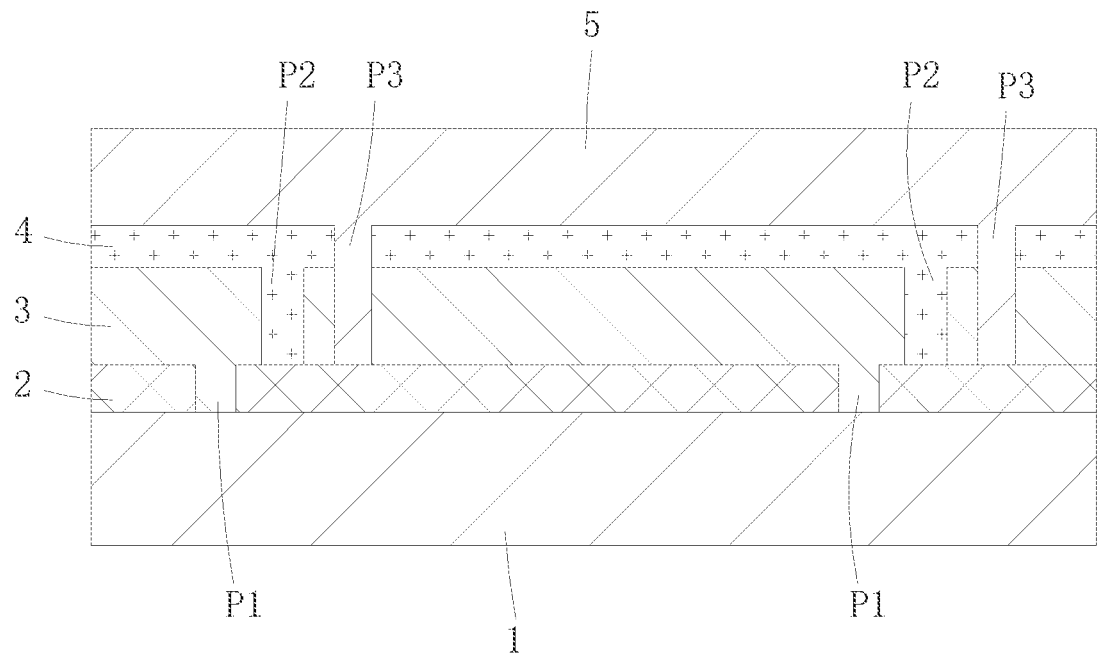
FIG. 4 is a schematic diagram illustrating laser cutting processing of an internal structure of another solar cell according to the present invention.

With reference to FIGS. 3 and 4, there are provided preferred embodiments of a solar cell cutting and passivation integrated processing method and a solar cell thereof in the present invention. The solar cell includes a substrate 1, a front electrode layer 2, a light absorption layer 3 and a back electrode layer 4 from bottom to top in sequence. The substrate 1 is disposed at bottom and the back electrode layer 4 is disposed at top.

Before laser structured cutting is performed for the back electrode layer 4, a protective layer 5 is disposed on a surface of the back electrode layer 4, and then laser structured cutting is performed for the back electrode layer 4, or the back electrode layer 4 and the light absorption layer 3 simultaneously through the protective layer 5 to obtain a corresponding structured trench P3 while the protective layer 5 is kept from being cut by laser. A material of the protective layer 5 is partially molten due to a localized high temperature generated by the laser processing in a laser structured cutting process and infiltrates into an underlying corresponding structured trench P3.

The laser ray is a focused light beam which has a maximum energy density on a focal plane and relatively low energy density at other positions. By adjusting a focal distance, the back electrode layer 4 is placed on a focal plane of the laser beam and has a relatively high laser energy density at this time. An interface of the back electrode layer 4 and the protective layer 5 and the material of the protective layer 5 are not located on the focal plane of the laser beam and have a relatively low laser energy density. When a laser beam (may be green light, ultraviolet light or infrared light) is irradiated down, partial energy is absorbed by the back electrode layer 4 such that the back electrode layer 4 is molten and partial energy is absorbed by the material of the protective layer 5 or the interface of the protective layer 5 and the back electrode layer 4 to enable the material of the protective layer 5 to melt and flow into a structured trench P3 newly cut by laser beam. In this case, the material of the cut-off part of the structured trench P3 is wrapped by the material of the protective layer 5 and mixed with the substance of the protective layer 5 and then filled into the structured trench P3 to prevent the cut-off structured trench P3 from contacting with other parts of the cell, thus forming trench protection. Since one layer of protective layer 5 is pressed on the back electrode layer 4, edge collapse will not easily occur at both side edges of the structured trench P3 during cutting, so as to improve the morphology of the cut-out structured trench P3. After the structured trench P3 is cut, other parts of the material of the protective layer 5 may be torn away or remain on the surface of the back electrode layer 4. The laser cutting may be performed under normal pressure or in a vacuum environment.

During cutting, attention may be paid to adjusting to a proper focal distance of laser beam to ensure the back electrode layer 4 is located on the focal plane of the laser beam and the material of the protective layer 5 is not located on the focal plane. During cutting, partial energy is absorbed by the back electrode layer 4 to form a structured trench P3 by melting, and partial energy is reflected and then absorbed by the interface of the material of the protective layer 5 and the back electrode layer 4, or the interior of the material of the protective layer 5, such that the material of the protective layer 5 melts and automatically flows into the structured trench P3 to form trench protection.

During cutting, light of proper wavelength is to be selected to provide energy of proper magnitude so as to ensure the structured trench P3 can be cut off without damaging P1 and P2. The material of the protective layer 5 also should be a material with a proper melting point, to ensure it can melt and flow into the structured trench P3, without causing the circumstances such as vaporization or non-meltability.

The structured trench P3 is a trench newly cut out by laser beam, or a trench cut out by laser beam on the back electrode layer 4 and the light absorption layer 3 at the same time.

The protective layer 5 is placed before the back electrode layer 4 is subjected to P3 laser cutting. By coating or deposition, the protective layer 5 may be prepared after the back electrode layer 4 is prepared. The material of the protective layer 5 acts to fully wrap the exposed material of the light absorption layer 3, so as to block direct contact between the material of the light absorption layer and air, and prevent other impurities from falling into the structured trench P3, thus improving the stability of the light absorption layer 3.

The solar cell cutting and passivation integrated processing method further includes: after the laser structured cutting process is completed for the back electrode layer 4 or the back electrode layer 4 and the light absorption layer 3 simultaneously, removing the protective layer 5 on the surface of the back electrode layer 4, and retaining the material of the protective layer 5 infiltrating into the structured trench P3.

During laser structured cutting, laser ray performs processing for the back electrode layer 4 at a side surface where the protection layer 5 is located.

During laser structured cutting, laser ray performs processing for the back electrode layer 4 at a side surface where the substrate 1 is located.

The material of the protective layer 5 is an inert material with a melting point below 600° C. and a conductivity below $10^{-7}$ S/M.

The protective layer 5 is a polymer plastic and the like, including silica gel, polydimethylsiloxane, polyphosphazene, polyethylene, polypropylene, and polystyrene etc. The polymer plastic is coated onto the surface of the back electrode layer 4 by coating to form a glue film.

The present invention further provides a solar cell. A structured trench on the back electrode layer 4 of the solar cell is processed using the above solar cell cutting and passivation integrated processing method, as shown in FIG. 3.

The present invention further provides a solar cell. A structured trench on the back electrode layer 4 and the light absorption layer 3 of the solar cell is processed using the above solar cell cutting and passivation integrated processing method, as shown in FIG. 4.

The solar cell cutting and passivation integrated processing method according to the present invention will be further described below in combination with specific embodiments.

An embodiment of a method of preparing a solar cell in the present invention includes the following steps.

(1) An ITO front electrode layer of 5 cm×5 cm is prepared on a glass substrate 1, and a structured trench P1 is cut out on the front electrode layer 2 by laser beam.

(2) The front electrode layer 2 processed using laser beam is ultrasonically cleaned for 30 min by use of detergent, de-ionized water, acetone and isopropanol in sequence, and then blow-dried by $N_2$, and then treated for 10 min through UV O-zone.

(3) An $NiO_x$ thin film is prepared as an electron transport layer on a surface of the front electrode layer 2.

(4) A perovskite light absorption layer 3 is prepared on a surface of the electron transport layer.

(5) a hole transport layer PCBM with a thickness of 20 nm-50 nm is deposited on the light absorption layer 3.

(6) Laser processing is performed on the hole transport layer to cut a structured trench P2, and the hole transport layer and the perovskite light absorption layer 3 are cut at the same time.

(7) A metal Ag conductive back electrode layer 4 is evaporated on a surface of the hole transport layer.

(8) One layer of silica gel is coated onto a surface of the back electrode layer 4 as a protective layer 5.

(9) Cutting of a structured trench P3 is performed on the back electrode layer 4 through the protective layer 5 by laser beam, and when the structured trench P3 is cut out, the material of the protective layer 5 is enabled to accurately flow into the structured trench P3 at the same time.

(10) Subsequent process is continued to complete the preparation process of the solar cell.

The above descriptions are only made to preferred embodiments of the present disclosure and shall not be intended to limit the present invention. Any changes, equivalent replacements and improvements etc. made within the spirit and principle of the present invention shall all fall within the scope of protection of the present invention.

INDUSTRIAL APPLICABILITY

Insert description paragraphs of the industrial applicability herein.

Free Text of Sequence Table

Insert description paragraphs of free text of sequence table herein.

The invention claimed is:

1. A solar cell, comprising a structured trench on a back electrode layer, the solar cell being formed by:
   providing the solar cell sequentially comprising a substrate, a front electrode layer, a light absorption layer and a back electrode layer,
   disposing a protective layer on a surface of the back electrode layer before laser structured cutting is performed for the back electrode layer,
   performing laser structured cutting for the back electrode layer, or the back electrode layer and the light absorption layer simultaneously through the protective layer to obtain a corresponding structured trench while the protective layer is kept from being cut by laser, and a material of the protective layer is partially molten due to a localized high temperature generated by the laser structured cutting and infiltrates into an underlying corresponding structured trench, and
   after the laser structured cutting process is completed for the back electrode layer or the back electrode layer and the light absorption layer simultaneously, removing the protective layer from the surface of the back electrode layer, and retaining the material of the protective layer infiltrated into the structured trench.

2. A solar cell, comprising a structured trench in a back electrode layer and a light absorption layer, the solar cell being formed by:
   providing the solar cell sequentially comprising a substrate, a front electrode layer, a light absorption layer and a back electrode layer,
   disposing a protective layer on a surface of the back electrode layer before laser structured cutting is performed for the back electrode layer,
   performing laser structured cutting for the back electrode layer, or the back electrode layer and the light absorption layer simultaneously through the protective layer to obtain a corresponding structured trench while the protective layer is kept from being cut by laser, and a material of the protective layer is partially molten due to a localized high temperature generated by the laser structured cutting and infiltrates into an underlying corresponding structured trench, and after the laser structured cutting process is completed for the back electrode layer or the back electrode layer and the light absorption layer simultaneously, removing the protective layer from the surface of the back electrode layer, and retaining the material of the protective layer infiltrated into the structured trench.

3. The solar cell of claim 1, wherein the laser structured cutting is performed at a side of the solar cell where the protective layer is located.

4. The solar cell of claim 1, wherein the laser structured cutting is performed at a side of the solar cell where the substrate is located.

5. The solar cell of claim 1, wherein the protective layer comprises an inert material with a melting point below 600° C. and a conductivity below $10^{-7}$ S/M.

6. The solar cell of claim 5, wherein the protective layer comprises a polymer plastic material.

7. The solar cell of claim 6, wherein the polymer plastic material comprises polydimethylsiloxane, polyphosphazene, polyethylene, polypropylene, or polystyrene.

8. The solar cell of claim 6, wherein the polymer plastic material is coated onto the surface of the back electrode layer to form a film.

9. The solar cell of claim 2, wherein the laser structured cutting is performed at a side of the solar cell where the protective layer is located.

10. The solar cell of claim 2, wherein the laser structured cutting is performed at a side of the solar cell where the substrate is located.

11. The solar cell of claim 2, wherein the protective layer comprises an inert material with a melting point below 600° C. and a conductivity below $10^{-7}$ S/M.

12. The solar cell of claim 11, wherein the protective layer comprises a polymer plastic material.

13. The solar cell of claim 12, wherein the polymer plastic material comprises polydimethylsiloxane, polyphosphazene, polyethylene, polypropylene, or polystyrene.

14. The solar cell of claim 12, wherein the polymer plastic material is coated onto the surface of the back electrode layer to form a film.

* * * * *